United States Patent [19]

Buchanan et al.

[11] 4,088,902
[45] May 9, 1978

[54] CHANNEL COUPLING

[75] Inventors: Donald George Buchanan, Cambridge; Roderick Frank Jones, London, both of England

[73] Assignee: Strathearn Audio Limited, Belfast, Ireland

[21] Appl. No.: 823,596

[22] Filed: Aug. 11, 1977

Related U.S. Application Data

[63] Continuation of Ser. No. 672,288, Mar. 31, 1976, abandoned.

[30] Foreign Application Priority Data

Apr. 2, 1975 United Kingdom ............... 13483/75

[51] Int. Cl.² ........................................... H03K 17/00
[52] U.S. Cl. .............................. 307/241; 179/15 BT; 328/103; 330/254
[58] Field of Search ...................... 179/15 ST, 15 BT; 328/103; 307/241, 242; 84/DIG. 27; 330/254, 261, 295

[56] References Cited

U.S. PATENT DOCUMENTS

| | | |
|---|---|---|
| 3,175,040 | 3/1965 | Von Recklinghausen ..... 179/15 BT |
| 3,662,113 | 5/1972 | Von Recklinghausen ..... 179/15 BT |

*Primary Examiner*—Stanley D. Miller, Jr.
*Assistant Examiner*—B. P. Davis
*Attorney, Agent, or Firm*—Cesari and McKenna

[57] ABSTRACT

An electrical circuit for use in controlling the coupling between two separate channels including a first transistor for connection in a first channel, a second transistor for connection in a second channel, a first and a second electrode of each transistor being connected in a respective output signal current carrying path, first signal coupling means connected between the said two first electrodes and second signal coupling means connected between the said two second electrodes, one of the said signal coupling means being variable.

2 Claims, 1 Drawing Figure

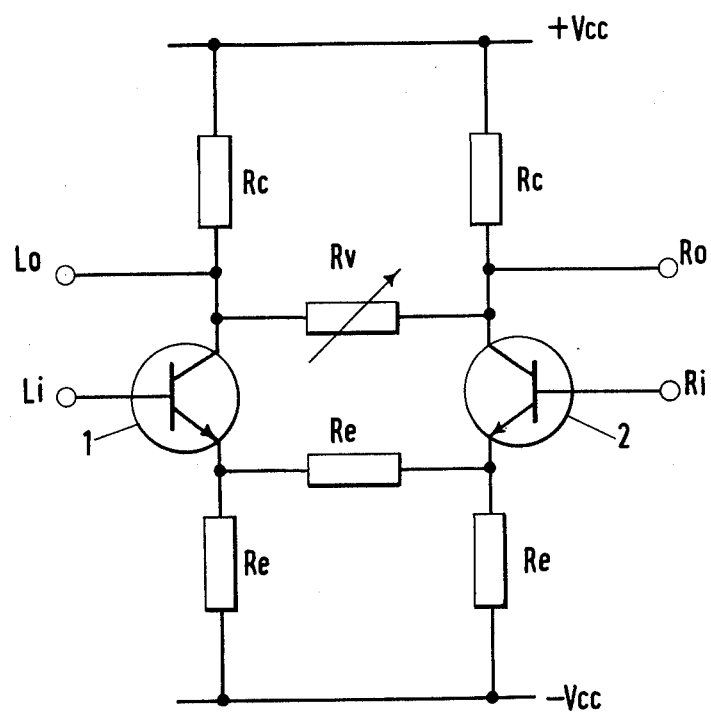

CHANNEL COUPLING

This is a continuation of application Ser. No. 672,288 filed Mar. 31, 1976, now abandoned.

This invention relates to a channel coupling circuit which has particular application to stereophonic amplifiers.

Circuits are known by means of which a user can, by blending a part of the signal on one stereophonic channel into the other stereophonic channel, reduce the apparent separation between the stereo images reproduced from a recording.

The present invention provides a circuit which allows a user either to increase the amount of information which is made available to both channels, thereby reducing the apparent stereo image separation, or to decrease the amount of information which the circuit has made common to each channel, thereby to increase the apparent separation of the stereo images reproduced, with a minimum of change in the apparent level of the sound reproduced.

An embodiment of the invention will now be described, by way of example, with reference to the single FIGURE of the accompanying drawing.

Referring to the drawing, there is shown a transistor 1 in a first channel of a stereophonic system having an input terminal Li connected to the base of the transistor 1 and an output terminal Lo connected to the collector of the transistor 1. A transistor 2 in a second channel of the system has an input terminal Ri connected to the base of the transistor 2 and an output terminal Ro connected to the collector of the transistor 2. The collectors of the transistors 1 and 2 are connected via respective resistors Rc to a + Vcc supply line and the emitters of the transistors 1 and 2 are connected via respective resistors Re to a − Vcc supply line. A further resistor Re couples the emitters of the transistors 1 and 2 and a variable resistance Rv couples the collectors of the transistors 1 and 2. The variable resistance Rv can be constituted by a manually operated variable resistor or it could be provided in some other way, for example it could be a semiconductor device whose resistance is varied by the variation of an electrical signal on a control electrode.

It will be seen that, in operation, if the value of the resistance $Rv = 0$, the gain of the transistor 2 from its input Ri to its output Ro is dependent upon the ratio Rc/2.Re, as is the gain of the transistor 1 from its input Li to its output Lo and the gain from input Li to output Ro and from input Ri to output Lo. Thus any two signals applied to the respective inputs Li and Ri are mixed equally to the two outputs Lo and Ro to provide a monophonic signal.

If the value of the resistance Rv equals that of the resistors Rc, the gain of the transistor 2 from the input Ri to the output Ro will be dependent upon the ratio Rc/Re and from the input Li to the output Ro the gain will be zero. Similarly, the gain of the transistor 1 from the input Li to the output Lo will be dependent upon the ratio Rc/Re and from the input Ri to the output Lo the gain will be zero. In this situation, pure stereophonic reproduction will be obtained with no transfer of signals between the channels.

In the case where the value of the resistance $Rv = \infty$ the gain of the transistor 2 from the input Ri to the output Ro and of the transistor 1 from the input Li to the output Lo is dependent upon the ratio 2Rc/Re. From the input Li to the output Ro and from the input Ri to the output Lo the gain will be dependent upon the ratio − Rc/Re, when the value of the resistance Rv is ∞. Thus, at the output Lo, a portion of the signal in the second channel containing the transistor 2 will be subtracted from the signal in the first channel containing the transistor 1, while at the output Ro a portion of the signal in the first channel will be subtracted from that in the second channel.

For signals which are common to both the input Li and the input Ri, the gain to each output will be dependent on the ratio Rc/Re, irrespective of the value of Rv.

The change in sound level will therefore be slight as the value of the resistance is varied, since in most recordings much of the signal is common to both stereophonic channels.

Although the invention has been described with reference to a particular embodiment, it will be appreciated that variations and modifications can be made within the scope of the invention. For example the transistors 1 and 2 could be PNP transistors with suitable circuit modifications, or FET transistors.

We claim:

1. A channel coupling circuit for use in controlling the coupling of signals between two separate channels including a first transistor for connection in a gain producing mode in a first channel, a second transistor for connection in a gain producing mode in a second channel, a first and a second electrode of each transistor being connected in a respective output signal current carrying path, an input terminal for each channel being connected directly to a third electrode of the transistor in that channel, an output terminal for each channel being connected directly to said first electrode of the transistor in that channel, a first impedance directly coupling said two first electrodes, a second impedance directly coupling said two second electrodes, one of said first and second impedances being variable, and a further impedance being connected to each first electrode in the respective output signal current carrying path, the relationship between the values of said first, second and further impedances determining the gains produced by said transistors between the input and output terminals in each channel and between the input terminal in one channel and the output terminal in the other channel and therefore the degree of coupling between the signals applied to the input terminals and the signals obtained from the output terminals of each channel.

2. A channel coupling circuit as claimed in claim 1 having a variable resistor connected between the said first electrodes of the respective transistors.

* * * * *